United States Patent [19]

Schwerdt

[11] 4,310,839
[45] Jan. 12, 1982

[54] INTERACTIVE DISPLAY SYSTEM WITH TOUCH DATA ENTRY

[75] Inventor: Kurt R. Schwerdt, Bolton, Mass.

[73] Assignee: Raytheon Company, Lexington, Mass.

[21] Appl. No.: 97,012

[22] Filed: Nov. 23, 1979

[51] Int. Cl.³ .............................................. G09G 1/00
[52] U.S. Cl. ............................... 340/712; 340/365 R; 340/709
[58] Field of Search ........... 340/709, 712, 711, 365 R, 340/365 C, 365 S; 200/317, 159 B

[56] References Cited

U.S. PATENT DOCUMENTS

| | | | |
|---|---|---|---|
| 3,220,000 | 11/1965 | Lesage | 340/365 R |
| 3,241,117 | 3/1966 | Schottle et al. | 340/711 X |
| 3,480,945 | 11/1969 | Nelson | 340/365 R |
| 3,648,272 | 3/1972 | Schroder et al. | 340/709 |
| 3,651,512 | 3/1972 | Summers | 340/365 R |
| 3,699,531 | 10/1972 | Heimann | 340/712 |
| 3,707,715 | 12/1972 | Perotto | 340/712 X |
| 4,017,848 | 4/1977 | Tannas | 340/712 X |
| 4,068,089 | 1/1978 | Kuhnlein et al. | 340/365 S |
| 4,186,392 | 1/1980 | Holz | 340/712 |
| 4,242,676 | 12/1980 | Piguet et al. | 340/712 X |

FOREIGN PATENT DOCUMENTS 54-119899  9/1979  Japan ..................... 340/712

Primary Examiner—David L. Trafton
Attorney, Agent, or Firm—William R. Clark; Milton D. Bartlett; Joseph D. Pannone

[57] ABSTRACT

An interactive tabular display system having thin membrane switches positioned on the display surface around the periphery. The switches are categorized as select or function depending on the particular application software program in use. Touching one of the select switches causes a cursor to be displayed in the row adjacent to that switch; automatically, the cursor incrementally advances across that row sequentially underlining data items. When the switch is opened, the data item underlined is displayed in reverse video and additional data related to that item is displayed elsewhere on the display. The switches are provided with backlighting to provide illuminated touch points for use in dimly lit operational rooms.

8 Claims, 5 Drawing Figures

INTERACTIVE DISPLAY SYSTEM WITH TOUCH DATA ENTRY

BACKGROUND OF THE INVENTION

Many digital data display systems require an interactive device for the operator to communicate with the associated computer system. In the prior art, many types of devices have been used. For example, inputs to the computer have been provided by keyboards, light-pens, track-balls, joy-sticks, etc. Numerous other devices and techniques have also been developed that permit direct touch identification of data on the CRT screen or other display surface. For example, in U.S. Pat. No. 4,001,807, a system is described wherein switch buttons adjacent to the CRT screen are used to identify data on the screen. Also, there are prior art approaches wherein CRT screen overlays are provided that are sensitive to touch or approaches wherein fields of sonic waves or light beams are interrupted by a finger or stylus.

The touch data entry method is very desirable because it is fast, easy, natural, flexible, inexpensive, and readily programmable. In general, touch data entry provides advantages in human factors over the other described entry methods. However, previous systems having touch data entry switches adjacent to the CRT screen had parallax errors and it was not always easy to correlate a data entry item of interest with a particular switch. Further, in some systems, it was necessary to separately push two switches; one switch designated the data column and the other switch designated the data row. Another alternative to pushing two switches was to press one switch successively. Furthermore, when the data item of interest was designated by touch data entry, the operator had to take further operator action to display designated detailed data. Data entry systems using overlays, sonic waves, and light beams have commonly been troubled with fingerprints on the overlay thus interfering with the viewing of the CRT display. Also, because of the curvature of the CRT, troubles have been encountered with reliability, repeatability of operation and inadvertent interference.

SUMMARY OF THE INVENTION

The invention discloses a tabular display device having a plurality of backlit switches with thickness less than 150 mils positioned in an approximately straight line covering at least a portion of the peripheral surface area of the face of the tabular display device. The tabular display device may include a cathode ray tube. The combination of elements provides a significant improvement in human factors over prior art touch data entry systems; parallax errors are reduced and the display area is not covered with fingerprints.

The invention may further be practiced by a tabular display device having switches positioned in an approximately straight line around the periphery of the face of the device with means responsive to one of the switches for advancing a cursor in incremental steps horizontally across the face adjacent to the switch. It may be preferable that the switches comprise membrane switches having a thickness of less than 150 mils. Further, it may be preferable that the advancing means includes a digital computer. Also, preferably the switches are backlit. Backlit is herein defined as being lit from underneath the switch.

It may further be preferable that means are provided for generating tabular data to be displayed on a cathode ray tube device, the data having a row that is adjacent to one of the switches. Further, it is preferable to have means responsive to one of the switches for displaying a cursor under an item of data in a row of data, the displaying means comprising means for incrementally moving the cursor across the row while the switch is closed and for providing reverse video for the data in the row underlined by the cursor when the switch is opened. Also, it may be preferable that the displaying means comprises means for generating additional data related to the data in reverse video.

BRIEF DESCRIPTION OF THE DRAWINGS

The foregoing and other objects and advantages of the invention will be understood more fully in the following detailed description thereof with reference to the accompanying drawings wherein.

DESCRIPTION OF PREFERRED EMBODIMENT

Figure 1:
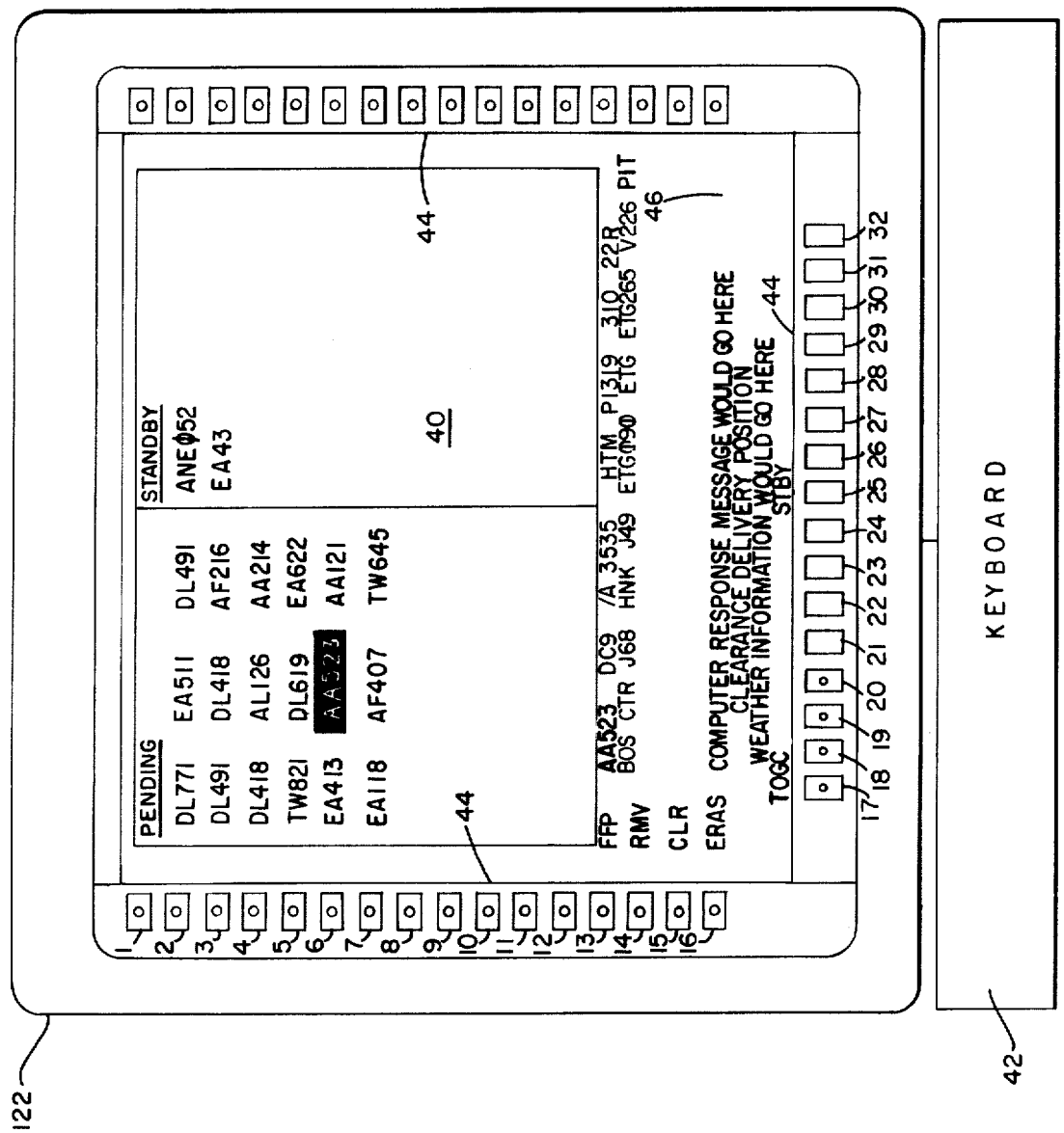
FIG. 1 is a pictorial view of a cathode ray tube having touch data entry switches and a keyboard.

Referring to FIG. 1, a pictorial view of a cathode ray tube (CRT) 40, with touch data entry switches 1-32 (and others unnumbered) and keyboard 42 is shown. Although many applications will be apparent to those skilled in the art, the description herein is with reference to a tabular video display for use within a terminal information processing system for air traffic control. Among other functions, software programs determine what stored data will be displayed and interacted with; the processing system will be described later herein. One example of a display information format as controlled by a particular software program program is shown in FIG. 1. More specifically, the software program is for a clearance delivery position at an airport control tower. An example of an operational scenario follows. Flights listed in the PENDING section (i.e. DL771 for Delta Flight 771, EA511 for Eastern Flight 511, etc.) are those aircraft that have filed a flight plan. The position operator receives a request from a particular aircraft requesting clearance and locates the flight in the PENDING section of the display. Because more detailed information is required for the clearance request, the operator identifies the flight to the computer by pushing the particular switch which is adjacent to the row of the flight of interest. In the example of FIG. 1, it is assumed that the flight of interest is AA523 which is American Airlines Flight 523. Upon the closure of switch 6, a cursor underline is displayed under the first flight of that row in column 1 which, for the example, is EA413. Sequentially, the cursor then advances in discrete steps across the row underlining each flight in the row for approximately 350 milliseconds (selectable within a range of 200-500 milliseconds). When the cursor underlines the flight of interest, i.e. AA523, the operator removes his finger from the switch. Without further operator action, the opening of switch 6 causes the flight presently underlined to be designated by reverse video and detailed flight information for that flight is presented in the full flight plan (FFP) section of the display format. For the example of FIG. 1, that information is AA523 which designates the flight, DC9 which is the type of aircraft, /A 3535 which is the transponder equipment qualifier and code, HTM which is the coordination fix, P1319 which is the proposed departure time, 310 which designates 31,000 feet as the planned altitude, 22R which is the runway, and the second line which is the flight path from Boston to Pittsburgh. If the aircraft is ready to proceed from the gate to the runway, the operator may push the TO GROUND CONTROL (TOGC) function switch 17 to transfer control to ground control. At that time, the switch label TOGC is momentarily displayed in reverse video and the flight number is removed from the PENDING section and transferred to a different operator position (ground control) in the control tower. If for any reason the aircraft is not ready to proceed to the runway, the operator may transfer the flight to the STANDBY section using the STANDBY (STBY) function switch 27. On depressing this switch, the flight number is removed from the PENDING section and appears in the STANDBY section. Other function switches of this particular scenario are REMOVE (RMV) switch 14 which removes a flight number from either the PENDING or STANDBY sections, CLEAR (CLR) switch 15 which clears the adjacent preview display area, which is a preview area of a message typed in from the keyboard, and ERASE (ERAS) switch 16 which erases the adjacent computer output message line. It is noted that for the described scenario, switches 2-12 are used to select flight numbers, and switches 14, 15, 16, 17 and 27 are used as function switches. For a different scenario, each switch including the unnumbered switches on the right perimeter of the CRT could be assigned a different function or identifying feature depending on the software program used.

Still referring to FIG. 1, three touch data entry switch devices 44 are attached to the CRT face around the perimeter on the sides and the bottom. Switches could also be located across the top of the CRT, but that location is least desirable operationally because of human factor considerations. Typically, the face of a CRT is covered by a bonded safety glass panel 46 that in addition to protection, provides a contrast enhancement filter; in such case, the switch devices are attached to the glass panel. Each device contains sixteen membrane switches which, as shown, define rows and columns on the CRT display. For different applications, it may be preferable to have more or fewer than sixteen switches on a CRT perimeter. In the preferred embodiment, the centers of adjacent switches are 0.5 inches apart which, for the particular display system, defines the distance between double spaced lines of tabular data; this distance is also consistent with desirable fingertip resolution spacing. Accordingly, each switch of a vertically mounted switch device corresponds to a row of data. The inner edge of the three switch devices and the upper edge of the CRT display define the usable raster area of the CRT.

Figure 2:
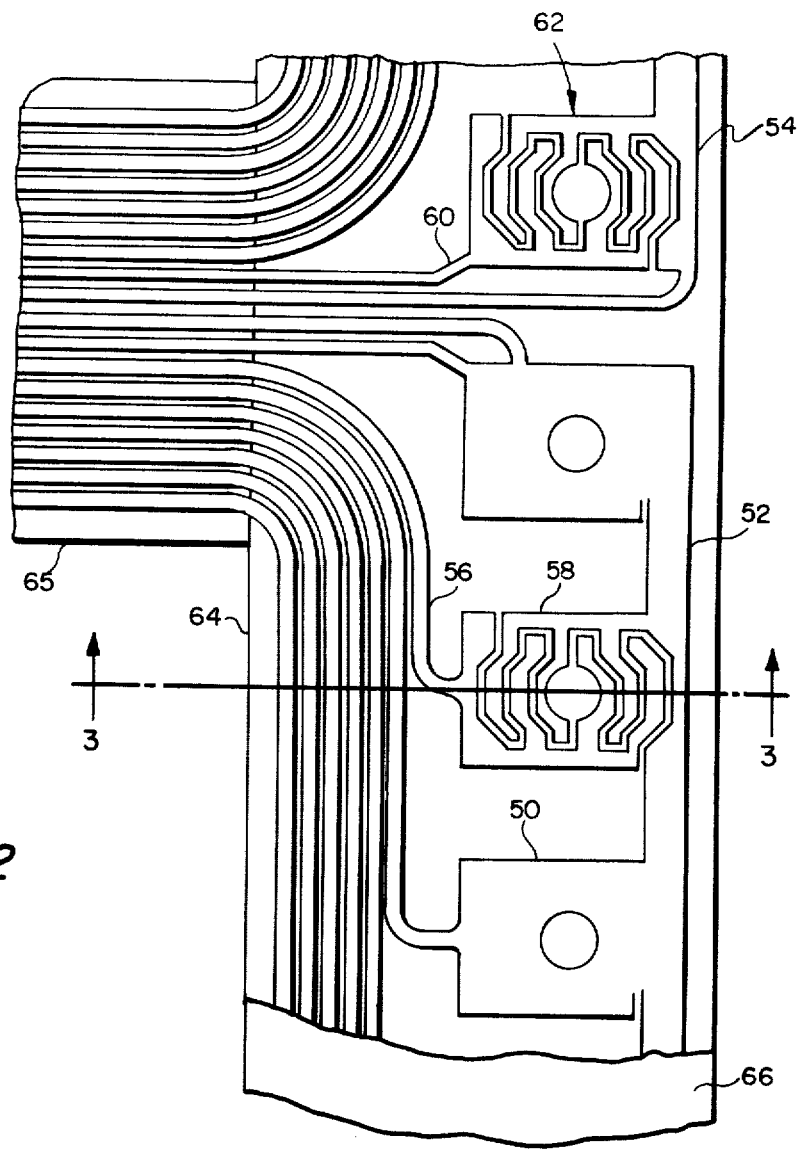
FIG. 2 is a cut-away view of several flex circuits which make up a switch device.

Referring to FIG. 2, there is a view of a portion of a flex circuit 50 which is one of the parts of switch device 44. Base conductor 52 defines the common lead for the eight switches on one end of the switch device; base conductor 54 defines the common lead for the eight switches on the other end of the switch device. Base conductor 56 defines the positive lead for switch 58. Base conductor 60 defines the positive lead for switch 62. All of the base conductors are bonded to switch base 64 which is a flexible polymide film. The base conductors consist of 60/40 tin/lead on copper because this combination is easy to process, durable, and has stable resistive properties. Other conductors such as, for example, aluminum or silver may also be used. All of the conductor base leads are routed along lead ribbon 65 and coupled to a connector (not shown). Switch base 64 is preferably fabricated from a thin strong flexible material that has high dielectric properties. Also, it is preferable that the switch base be semitransparent to permit the passage of light from conventional electroluminescent panel 66; the electroluminescent panel provides switch back lighting for operation in dimly lit operational rooms. Preferably, a dimmer switch (not shown) is provided for varying the intensity of back lighting. The color of the electroluminescent panel may preferably be matched to the phosphor color of the CRT.

Figure 3:
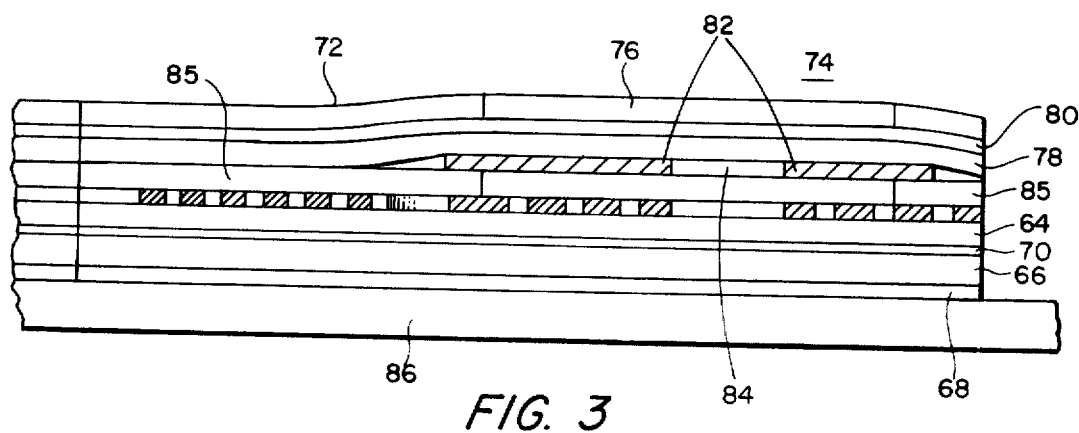
FIG. 3 is a cross-section of a switch device taken along line 3—3 of FIG. 2.

Referring to FIG. 3, a cross-section of a switch device taken along line 3—3 of FIG. 2 is shown. The bottom five layers have heretofore been described with reference to FIG. 2 except for transparent adhesive layers 68 and 70. Surface layer 72 is fabricated of polycarbonate because it is tough and scratch resistant. Preferably, the surface layer does not provide any surface reflection. The polycarbonate layer provides favorable aesthetics and may be coated on the underside with an appropriate color of paint. Cutouts 76 in the surface layer define the finger touch areas 74 for the switches. The surface layer is bonded to deformable membrane 78 by adhesive layer 80. Deformable membrane is fabricated of polyester because it is resilient and provides a protective seal. It is also important that the deformable membrane be substantially transparent to light so as to provide back lighting of the switch. Top conductor 82 is silk screened onto the deformable membrane layer to form a conductive pad. A 0.1 inch hole 84 is provided in the center of top conductor to permit the passage of light from electroluminescent panel 66 for back lighting. Top conductor consists of silver particles in a latex carrier. When pressure is applied to the switch from the top, the top conductor touches the flex circuit and provides electrical conduction between the positive and common conductors therein thus closing the switch. Spacer layer 85 is a pressure sensitive adhesive; it provides insulation of the top and base conductors unless pressure is applied to the switch. The remaining layers of FIG. 3 were described with reference to FIG. 2. Also, as discussed earlier herein, layer 86 as shown in FIG. 3 may be either the CRT face or any transparent layer covering it such as, for example, a bonded safety glass panel.

The thickness of the switch device, including all of the layers described in the previous paragraphs, is only about 50 or 60 mils. Because these membrane switches are so thin and can be contoured to the curvature of the CRT, the invention provides for significant reduction in parallax errors over prior art periphery switches. In other words, considering human factors, the operator can quickly and efficiently relate each row or column of data or function label with its corresponding switch. Furthermore, once that correspondence is made, the operator can, with one finger (or any pressure object of appropriate size such as a pencil with eraser), identify a data item within that row or column in a minimum amount of time and without causing fingerprints on the display. Without further operator intervention, the data item is displayed in reverse video identifying that it has been selected and details of that item are displayed. The invention therefore provides significant human factor improvements over the prior art of interactive tabular data displays.

Figure 4:
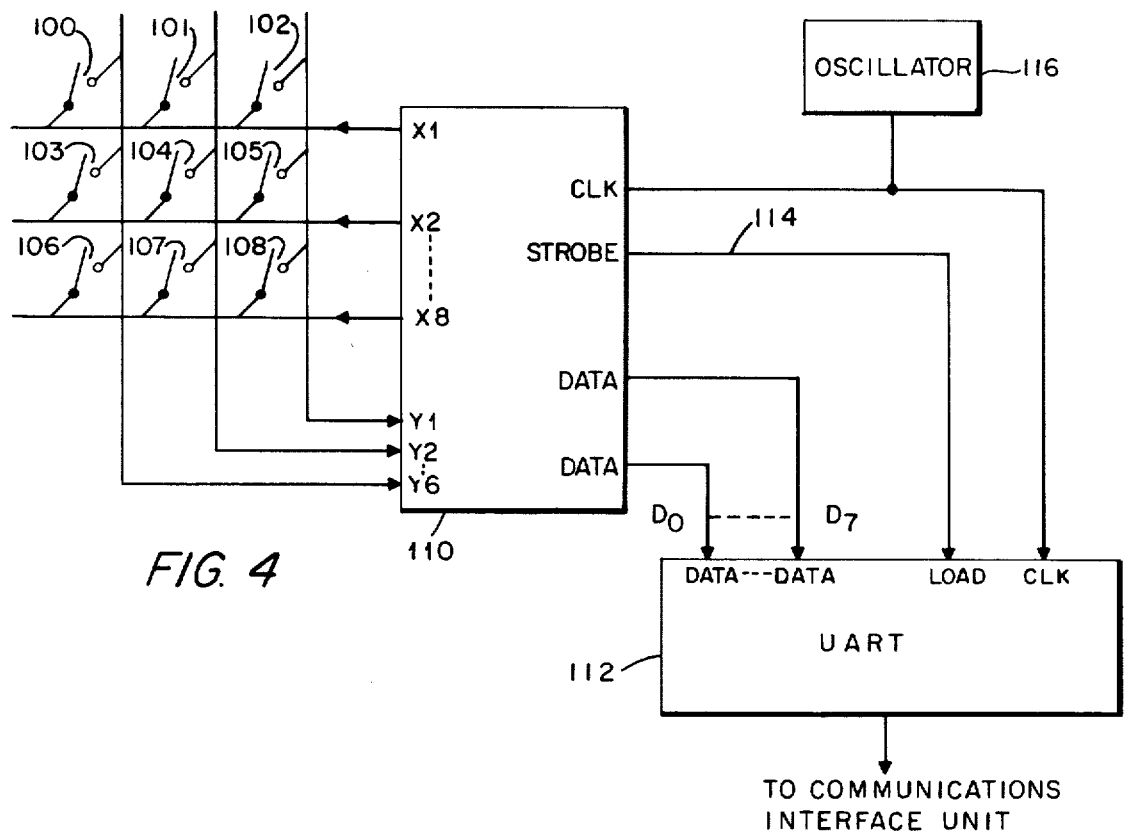
FIG. 4 is a touch switch encoder circuit and UART.

Referring to FIG. 4, a touch switch encoder circuit used with advantage in the invention is shown. Switches 100–108 are representative of 48 membrane switches shown in FIG. 1. More specifically, switches 100–108 are part of a 6×8 switch array as indicated by X1, X2, . . . X8 and Y1, Y2, . . . Y6 of encoder 110. As is well known in the art, encoder 110 provides a matrix scan of the switch array. If a switch is closed such that a logical one is provided at a Y input, a read only memory (not shown) within the encoder is addressed and the code for that switch is transferred to universal asynchronous receiver transmitter (UART) 112 on lines D0–D7. The code may be any appropriate code such as, for example, ASCII. A strobe line 114 provides that the switch code is transferred as long as the switch is closed; when the switch is opened by removing the pressure, a different code is transferred to UART 112. An example of encoder 110 is a General Instruments AY-5-2376. Oscillator 116 provides a clock of 153.6 KHz to encoder 110 and UART 112. In summary, the function of encoder 110 is to provide a parallel 8 bit code which corresponds to an activated switch. When the switch opens, a different code is provided. The function of UART 112 is to provide parallel to serial conversion for a transfer to communications interface unit 120. An example of a UART is Texas Instruments TMS 6011.

Figure 5:
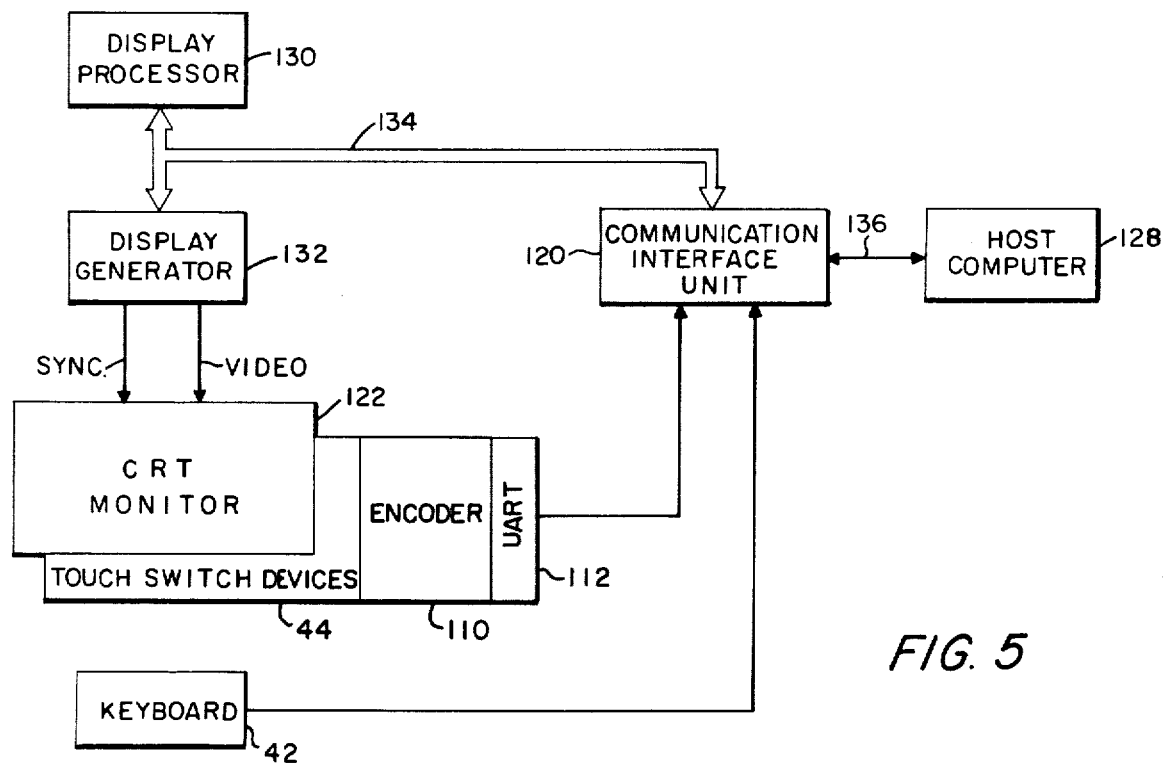
FIG. 5 is a functional block diagram of a display system using the invention to advantage.

Referring to FIG. 5, a functional block diagram of a display system in which the invention is used to advantage is shown. CRT monitor 122 contains a tabular CRT such as a 15 inch diagonal Ball Brothers Model TTL-150. Also included in the monitor and not shown are a power supply, analog drive circuitry and a TTL compatible interface. The only signals required to operate the CRT monitor are therefore a horizontal sync, a vertical sync, and video. The touch switch devices and encoder have been described in detail heretofore. Keyboard 42 may be of any conventional type and is preferably back lighted for use in dimly lit operational rooms. The outputs of keyboard 42 and touch switch encoder as described with reference to FIG. 4 are coupled to communication interface unit 120. The communication interface unit provides serial, asynchronous, full duplex interface to host computer 128 and serial, asynchronous, simplex interface to keyboard 42 and touch switch devices 44. Outputs from the keyboard, touch switch encoder UART 112 and the host computer are coupled to individual UART's (not shown), within the communication interface unit. Interrupt outputs from these UART's are ORed together and coupled to display processor 130. Upon receipt of an interrupt, display processor polls by priority the communication interface unit to determine the status of each UART.

Two of the components (not shown) of display processor 130 are a conventional microprocessor such as, for example, a Motorola MC 6800 and a memory. One purpose of display processor 130 is to build up and store in memory a character refresh image for the CRT display. In each refresh cycle of the CRT, all character codes of the character refresh image are transferred to display generator 132 which formats and times the data to present sync and video signals to the CRT monitor 122. The microprocessor also receives keyboard and touch switch device inputs; from these inputs, the microprocessor generates messages to host computer 128. The host computer responds by providing display update data relating to, for example, cursor, reverse video, and display of new or additional data. Bus 134 provides for the transfer of data and/or messages between display processor 130, communications interface unit 120, and display generator 132.

Host computer 128 is typically interconnected with a plurality of display systems of the type shown in FIG. 5 and connected to by line 136. As the functions of display processor 130 are basically limited to controlling communication with host computer 128 and providing a character refresh image for display generator 132, all other processing functions are generally provided by host computer 128. For example, if a keyboard entry were made that requests the operator position be changed from Local Control Position to Ground Control Position, the display processor would interpret the request and format an appropriate message to host computer. As the request would require a complete update of display data, the host computer would send to display processor a lengthy message that includes all of the codes for updating the character refresh image in memory therein. The update data is derived from a large data base within host computer. Further, as an example, when a select touch switch is pressed, the display processor generates a message to host computer and host computer responds by providing a message that is used to update the character refresh image in memory in the display processor with respect to a cursor. The programming of the display processor and the host computer to provide the operational capability described herein is well known to one skilled in the art. An example of such capabilities is the sequencing of the cursor when a touch switch is closed and the automatic display of data and reverse video when it is then opened.

This concludes the description of the preferred embodiment. However, many alterations and modifications will be apparent to those skilled in the art without departing from the spirit and scope of the invention. For example, the invention will have advantage in use with any tabular display system such as one having a plasma panel display; the application is not limited to CRT devices. It is therefore intended that the scope of the invention be limited only by the claims.

What is claimed is:

1. In combination:
   means for displaying horizontal lines of data, said displaying means comprising an active tabular display device;
   a plurality of switches connected to said device;
   said switches being positioned in a substantially vertical column covering at least a portion of the peripheral surface area of the face of said tabular display device;
   said switches being less than 150 mils thick; and
   at least some of said switches being horizontally aligned with said horizontal lines of data for visual correspondence therewith.

2. The combination in accordance with claim 1 wherein said tabular display device comprises a cathode ray tube.

3. In combination:
   means for displaying horizontal lines of data, said displaying means comprising an active tabular display device;

a plurality of switches connected to the face of said tabular display device, the positioning of said switches being outside the area of said face where tabular data is displayed;

said switches being positioned in a substantially vertical column covering at least a portion of the peripheral surface area of the face of said tabular display device;

said switches being less than 150 mils thick; and at least some of said switches being horizontally aligned with said horizontal lines of data for visual correspondence therewith, and means for providing backlighting of said switches.

4. The combination in accordance with claim 3 wherein said tabular display device comprises a cathode ray tube.

5. The combination in accordance with claim 3 wherein said switches comprise membrane switches having a thickness of less than 150 mils.

6. In combination:

a cathode ray tube;

a transparent layer covering the face of said cathode ray tube;

a plurality of switches connected to said layer, the positioning of said switches being out of the area of the said face where tabular data is displayed;

said switches being positioned in a substantially vertical column covering at least a portion of the peripheral surface area of the face of said tubular display device;

said switches being less than 150 mils thick;

at least some of said switches being horizontally aligned with said horizontal lines of data for visual correspondence therewith; and means for providing backlighting of said switches.

7. The combination in accordance with claim 6 wherein said switches comprise membrane switches having a thickness of less than 150 mils.

8. The combination in accordance with claim 1 further comprising means for backlighting said switches.

* * * * *